United States Patent [19]

Valy et al.

[11] Patent Number: 4,833,334
[45] Date of Patent: May 23, 1989

[54] PROTECTIVE BOX FOR ELECTRONIC CIRCUITS HARDENED WITH RESPECT TO X-RAYS

[75] Inventors: Yves Valy, Saint Medard En Jalles; Michel Gadbin, Merignac; Jean S. L. Banchelin, Le Haillan; Jean Bourcereau, Bordeaux, all of France

[73] Assignee: Aerospatiale, Societe Nationale Industrielle, Paris Cedex, France

[21] Appl. No.: 35,981

[22] Filed: Apr. 8, 1987

[30] Foreign Application Priority Data

Apr. 16, 1986 [FR] France .................... 86 05442

[51] Int. Cl.⁴ .................... G21F 1/00; G21C 11/00
[52] U.S. Cl. .................... 250/515.1
[58] Field of Search ............ 250/515.1, 505.1, 506.1, 250/517.1, 518.1

[56] References Cited

U.S. PATENT DOCUMENTS

| | | | |
|---|---|---|---|
| 1,844,512 | 2/1932 | Mains | 250/515.1 |
| 2,928,948 | 3/1960 | Silversher | 250/515.1 |
| 3,622,432 | 11/1971 | McCluer et al. | 250/515.1 |

FOREIGN PATENT DOCUMENTS

| | | |
|---|---|---|
| 0128079 | 12/1984 | European Pat. Off. . |
| 2406870 | 5/1979 | France . |
| 2584863 | 1/1987 | France .................... 250/515.1 |

OTHER PUBLICATIONS

Abstract of Japanese Patent No. 60-186040.
Abstract of Japanese Patent No. 60-134448.

*Primary Examiner*—Bruce C. Anderson
*Attorney, Agent, or Firm*—Pearne, Gordon, McCoy & Granger

[57] ABSTRACT

Protective box for electronic circuits hardened with respect to X-rays. The protective box comprises a base and a cover fixed to the base, formed from a rigid mechanical structure constituted by a composite material formed by a fibre-reinforced resin, an X-ray protection material partly covering the outer surface of the mechanical structure, said X-ray protection material being formed by a resin matrix containing a powder of a metal with an atomic number at least equal to 47 and with a melting point at least equal to 630° C., a material formed from an element with a low atomic number forming the outer surface of the cover and optionally a good electricity conducting material covering the inner surface of the mechanical structure.

11 Claims, 1 Drawing Sheet

PROTECTIVE BOX FOR ELECTRONIC CIRCUITS HARDENED WITH RESPECT TO X-RAYS

BACKGROUND OF THE INVENTION

The present invention relates to a protective box for electronic circuits hardened with respect to X-rays. It more especially applies to protecting high performance electronic circuits used in the aeronautical and space fields against X-rays.

High-performance electronic circuits, both from the processing speed and the capacity standpoints, are very sensitive to the effects of X-rays. These effects can even lead to the destruction of the active components of the electronic circuits involving latch up phenomena.

Apart from the X-radiation dose or quantity received, a particularly important parameter is that of the time during which said quantity is supplied. The dose associated with its application time is called the dose rate. The behavior or resistance of the active components of the electronic circuits with respect to said parameters (dose, dose rate) and the energy spectrum of said radiation is essentially linked with the production technology thereof. In most cases, it is necessary to reduce the dose levels and rates in order to permit the electronic circuits to retain their functional integrity.

One of the most widely used methods for reducing doses and dose rates received by electronic circuits consists of enclosing them in an envelope made from a pure metal with a high atomic number. The metal and thickness of the metal sheet are chosen and adapted as a function of the energy of the X-radiation in question and the desired filtering rate. This metal sheet effectively protects against high X-ray doses and dose rates. As a function of the circuits and/or technology of the electronic components, the need for protection can be felt as from 1 to 10 Krad and $10^5$ to $10^7$ rad.s.

Generally, the metal sheet covers a metal structure, particularly of light alloy, enclosing the electronic circuits, said structure providing the necessary mechanical strength and protection. The metal sheet is mechanically fixed over the entire outer surface of the metal structure.

Unfortunately the realization of the most interesting metals for this type of protection is difficult and costly. Moreover, the requirements with respect to said protection materials and the guarantee that they will not deteriorate under various ionizing, mechanical and climatic surrounding conditions means that the weight breakdown of the electronic circuits is highly increased, compared with circuits which are not protected against X-rays.

In most cases, the metal sheet for protecting against X-rays cannot be engaged directly over the entire outer surfaces of the metal structure of the encapsulating box due to the often complex profile thereof. This profile complexity is often imposed by heat dissipation constraints.

Therefore the volume defined by the metal protection sheet is greater than the volume of the mechanical structure to be protected. This leads to an increase in the weight and overall dimensions of the mechanical structure, which is further increased by the mechanical devices required for maintaining the metal sheet in place on the mechanical structure (spacers, angle brackets, screws, bolts, etc.). In addition, these maintenance devices must be made from the same metal as the metal protection sheet, so as not to create "holes" in the protection against X-rays.

Furthermore, as the mechanical structure is made from a metal or alloy, this further increases the total weight of the box for encapsulating the electronic circuits.

It is clear that these disadvantages as regards the overall dimensions and weight of the encapsulating boxes are particularly prejudicial with respect to the use of electronic circuits on-board aircraft.

Another method consists of directly depositing the X-ray protection metal on the mechanical structure to be protected either by impregnating the latter in a liquid bath, or by electrolysis. However, these deposition processes are not possible for all the metals usable for providing protection against X-rays. Moreover, in this case it is also necessary to examine the corrosion compatibilities of the metals present.

In addition, the thicknesses which can be deposited for the metals lending themselves to this procedure are limited, otherwise the deposit adhesion quality may be prejudiced. Moreover, the obtaining of a homogeneous deposit makes it necessary to proceed in successive stages with further machining between the deposits so that, in certain cases, the dimensions of the encapsulating box are respected in the final stage. Thus, these deposition methods are limited and lead to a high cost of the X-ray protection encapsulating boxes.

Another approach consists of envisaging a specific protection for each on-board electronic component, which constitutes a different and more advance solution compared with those referred to hereinbefore. This specific protection described in FR-A-2 547 113, filed on 3 June 1983, consists of using several stacked layers of different materials having different atomic numbers (Z).

Materials with a high atomic number are dielectric ceramics, such as barium or neodymium titanate, titanium oxide or a complex lead-based ceramic. Materials having a low atomic number are carbon, aluminium, silicon, alumina and silica.

As a function of the applications and number of components involved, the number of individual protections can be more disadvantageous from the weight standpoint than an overall protection of all the electronic components. Moreover, the technology for producing the different materials forming the piles or stacks is based on processes used for the production of capacitors and in particular fritting processes. In particular, the process described does not make it possible to obtain an X-ray protection material with a complex shape.

Within the framework of protecting persons working in the presence of X-rays, the materials mainly comprise a charge such as lead, dispersed in an organic binder. Such protection materials are in particular described in FR-A-2 190 717, filed in the name of the Giken Company, FR-A-2 482 761, filed in the name of A. Maurin and US-A-3 622 432 of H. K. Porter Company.

These lead-based materials can only be used as X-ray protection materials for radiation with a low flow rate associated with relatively long dose distribution times.

Another known electronic circuit encapsulating box is described in FR-A-2 490 917, filed on 2 September 1980. This box is made from a moulded plastic material, such as an epoxy resin, in which the electronic circuits are embedded. This box is extremely thin and does not make it possible to effectively mechanically protect the electronic circuits. Moreover, there is no X-ray protection.

The present invention relates to a box for protecting electronic circuits hardened with respect to X-rays and making it possible to obviate the various disadvantages referred to hereinbefore. Compared with the use of a heavy metal sheet covering a metal structure, this protective box in particular leads to an important weight and overall dimension gain, whilst effectively protecting against radiation with a high dose rate and in particular exceeding those referred to hereinbefore.

Moreover, this protective box causes no major manufacturing problem and can be manufactured in a much shorter time than that necessary for manufacturing prior art encapsulating boxes.

Moreover, compared with FR-A-2 547 113, the invention makes it possible to bring about a development of the X-ray protection levels without any detrimental affect on the definition of the electronic circuits contained in the box.

SUMMARY OF THE INVENTION

The present invention specifically relates to a protective box for electronic circuits hardened with respect to X-rays, wherein it comprises at least one element formed from a rigid mechanical structure made from a composite material, constituted by a fibre-reinforced resin, and an X-ray protection material at least partly covering the mechanical structure and which is formed from a resin matrix containing, in the form of a regularly dispersed powder, at least one metal and/or at least one inorganic compound of a metal, the powder only melting at a temperature at least equal to 630° C. and the metal having a high atomic number at least equal to 47.

In particular, the powder can be constituted by a metal and an inorganic compound of said same metal or another metal. This metal and this inorganic compound has a melting temperature equal to or above 630° C.

The term element of the box is understood to mean any part used in the formation of the box, such as the cover or the base on which the cover is fixed, as well as part of the cover or base (case of a cover or base in several parts). The X-ray protection must be associated with all the visible faces of the box, bearing in mind the random direction of X-rays.

The use of materials with high melting points makes it possible to avoid undesirable effects due to heat shocks caused within the material during X-radiation, such as the surface melting of the powder grains which can lead to the destruction of the protective material. Moreover, the use of a metal with a high atomic number equal to or greater than 47 permits an effective X-ray filtering. For an equal material quantity, the use of powder regularly distributed in a resin matrix leads to an efficiency loss compared with pure sheet metal, all other conditions being the same. As this efficiency loss is essentially a function of the grain size of the powder and the powder quanitity in the organic binder, preference is given to a powder having a grain size between 0.5 and 25 µm and e.g. between 1.6 and 10 µm.

In the same way the powder quantity in the binder can range between 25 and 50% by volume of the finished X-ray protection material. The doping quantity of the organic binder in this range is a function of the sought X-ray protection efficiency. This also applies with respect to the thickness of the X-ray protection material.

The resin used for forming the matrix of protective material can be a thermoplastic or thermosetting resin, whose heat expansion coefficient is compatible with that of the composite material forming the mechanical structure and whose polymerization catalyst is compatible with the resin of said composite material.

As a resin entering into the composition of the X-ray protection material, examples are polyamides, polyethers, polyesters, phenoplastics, polyolefines, epoxydes, polyimides, silicones, furans, etc.

The metal powder embedded in the organic matrix of the X-ray protection material can be a silver, antimony, barium, rare earth, tantalum, tungsten, rhenium, iridium, platinum, gold, uranium or hafnium powder or a powder formed from a mixture of these metals. Preference is given to the use of silver, tantalum, tungsten or uranium.

When the powder is formed by an inorganic component, the latter can be an oxide, a nitride or a carbide of a heavy metal, such as those referred to hereinbefore. In particular, the inorganic compound is an oxide, nitride or carbide of silver, tantalum, tungsten or uranium when said compound effectively exists.

In order to optimize the protection against X-rays over a very broad energy spectrum, it is possible to use one or more metals and/or one or more inorganic compounds of a metal.

The rigid mechanical structure is constituted by a material able to withstand the mechanical stresses which the final protective box is exposed. It can be formed from a thermoplastic or thermosetting resin reinforced by fibres.

However, in order to ensure an excellent mechanical strength, preference is given to the use of thermosetting resins, such as epoxy, phenolic, polyester, polyimide and furan resins. The reinforcing fibres can be short or long and can be made from an organic or inorganic material, such as glass, carbon, boron, kevlar or metal. This composite material (resin + fibres) has a density between 1.2 and 1.8 instead of 2.8 for aluminium. The weight gain of a rigid structure according to the invention is consequently significant.

The mechanical structure has a shape and size corresponding to the needs for fixing and housing the electronic circuits to be located there. It is obtained by moulding by injection, by compression or by a hybrid method called "compressiontransfer moulding", described in French patent application No. 85 18769 filed by the present Application on 18 December 1985.

On the thus obtained rigid structure is effected a potting of the X-ray protection material either by injection, or by compression. In order to ensure a good adhesion of the X-ray protection material to the mechanical structure, the latter can be previously heated and/or can be subject to a surface preparation.

In order to obtain a good distribution of the powder in the organic binder forming the X-ray protection material for bringing about homogeneity of the opacity, prior to potting premixing takes place of the powder and binder. This premixing is performed either by mixing the powder with melted grains of resin and then forming mixture granules by extrusion, or by simply mixing the powders, or by mixing the powder in an organic liquid binder. This premix is then introduced in the mould to be polymerized on the mechanical structure.

The production of the X-ray protection material by potting makes it possible to ensure a continuous, homogeneous adhesion of the material on the rigid mechanical structure. This makes it possible to reduce the overall dimensions of the encapsulating box compared with the prior art solutions.

In order to improve the attachment of the X-ray protection material to the rigid mechanical structure, the latter can have slots formed during the moulding of the structure. These slots are filled with X-ray protection material during the potting thereof, thus ensuring a sought supplementary attachment effect.

In order to prevent the emission of electrons by the walls or elements of the protection box during X-ray irradiation and in particular by the metal powder, the box element can be covered with a material formed from at least one element having a low atomic number, at the most equal to 6, at least partly constituting the outer or inner surface of said box element.

This material has a thickness exceeding the mean free travel of the electrons emitted by the walls of the box protected against X-rays during X-ray irradiation. It always forms the final layer with respect to the surrounding atmosphere.

The element with a low atomic number can be carbon, boron or beryllium.

The material for preventing the emissivity effects of the protective box walls is generally known under the name anti-SGEMP material (System Generating ElectroMagnetic Pulse). It can be in the form of a paint containing particles of the element with an atomic number at the most equal to 6 and is e.g. of Astral type Pyroflex 7D 713.

Advantageously, the considered element of the protective box is equipped with a material which is a good electricity conductor which serves to filter the electromagnetic waves other than the X-rays, whereby said material covers the outer surface of the assembly formed by the mechanical structure and the X-ray protection material and/or the inner surface of said mechanical structure. This good electricity conducting material constitutes a Faraday cage protecting the electronic circuits located in the protective box and will hereinafter be called a faradization material. The faradization material can be nickel, silver, pure aluminium, copper and beryllium. Beryllium has the advantage of being able to serve both as an anti-SGEMP material and as a Faraday cage, due to its low atomic number and its good electrical conductivity.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

With a view to simplifying the description, the latter refers to a protective box formed from a monoblock cover fixed to base and formed by a single part, in which the element liable to be irradiated by X-rays is the box. The possible directions of the X-ray flux are represented by arrows F in FIGS. 1 to 3. As stated hereinbefore, the invention clearly has a much wider application.

Figure 1:
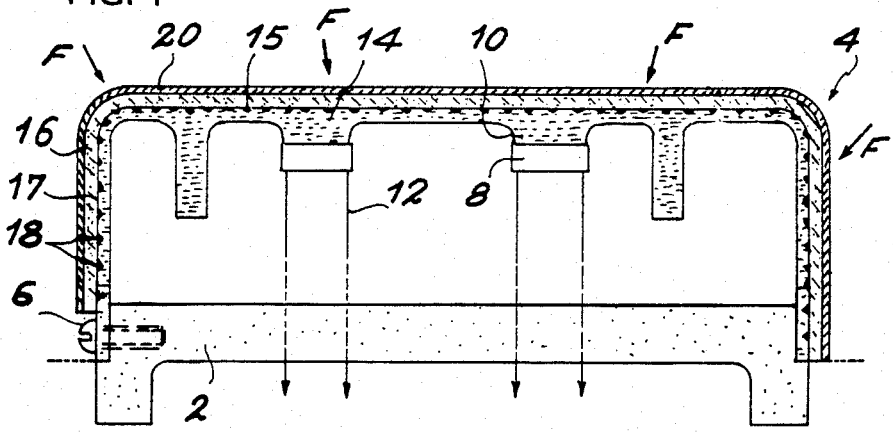
FIG. 1: Diagrammatically in longitudinal section a first embodiment of the protection means according to the invention.

FIG. 1 diagrammatically shows in longitudinal section a box for protecting electronic circuits having a base 2, on which is fixed a cover 4, e.g. using screws 6. This box receives electronic circuits 8. In particular, these circuits can be fixed by any known means to bosses 10 provided for this purpose on the inner face of the box cover 4. In very diagrammatic manner as it does not form part of the object of the invention, the electronic circuits 8 are connected to electrical circuits outside the box by conductive tracks indicated at 12 and which e.g. pass through the box base 2. The specific shape of the box, as well as the fixing and connection of the electronic circuits located in the X-ray protection box are linked with the type of components used. These components can be encapsulated in boxes TO 5, TO 66, etc.

According to the invention, cover 4 has a rigid structure 14 ensuring the mechanical protection of the electronic circuits. Structure 14 is formed from a thermosetting plastics material, such as bakelite, polyimide resin or silicones, reinforced by organic or non-organic fibres. Structure 14 is e.g. made from KINEL 5504 marketed by Rhone Poulenc, said material being a polyimide resin reinforced by long glass fibres arranged in a random manner. This rigid structure 14 is formed by moulding, either by injection, or by compression, said procedures being well known in the art. It can have a thickness of 2 mm.

The protection against X-rays of the electronic circuits 8 located in the box is ensured with the aid of a layer material 16 in contact with the inner surface of the rigid structure 14 or, as shown in the drawing, in contact with the outer surface of the rigid structure.

The X-ray protection material 16 covers all the outer surface of structure 14 liable to be irradiated by X-rays. In the case shown in FIG. 1, the material layer 16 covers the entire outer surface of structure 14, namely upper face 15 and side faces 17 of said structure.

In order to ensure a good adhesion of the protective material 16 to rigid structure 14, the latter can have lots 18 formed during the molding of the rigid structure 14. These slots 18 are filled with X-ray protection material during the potting of the latter.

The X-ray protection material 16 is e.g. formed from a tungsten powder representing 30% by volume of the finished product and which is regularly dispersed in a PA11 resin produced by ATOCHEM. This resin is a thermoplastic polyamide resin. The tungsten powder has an average grain size of 4 μm, a dispersion of 2.5 and a purity of 99.9%.

This protective material can be obtained by melting granules of PA11 resin, to which the tungsten powder is added. The premix obtained is introduced into a Werner ZSK30 extruder-granulator, in order to obtain mixture granules which can then be introduced into a mold already containing the rigid structure 14 to be covered by the X-ray protection material. The introduction of the mixture granules into the mold takes place by injection. The potting of the X-ray protection material is assured on rigid structure 14 heated in order to facilitate the adhesion of the X-ray material. The protective material obtained can have a thickness of 1.5 mm.

The molding and potting respectively of rigid structure 14 and X-ray protection material 16 make it possible to directly obtain protective box covers with the requisite dimensions and accuracies without further machining being required. Moreover, these molding procedures are particularly advantageous from the financial and manufacturing time standpoints, because the runs of box covers to be produced make it possible to reduce the costs of specific tools for each box model.

The X-ray protection material can also be constituted by a powder containing 6% by volume of tungsten and 24% by volume of uranium dioxide ($UO_2$) embedded in PA11 resin. This material can have a thickness of 2 mm, in order to ensure effective filtering.

In the same way, the PA11 polyamide resin can be replaced by a polyether block amide resin, such as that marketed under the trade name DINYL by Rhône-Poulenc. The resin of protective material 16 can also be bakelite or silicone.

To avoid raising the electromagnetic level due to electron emission by the outer walls of the protective box during X-ray irradiation and in particular by the metal contained in the X-ray protection material 16, an anti-SGEMP material 20 forming the outer surface of cover 4 can be provided. In the case shown in FIG. 1, material 20 covers the entire X-ray protection material 16. It is made from beryllium so that, apart from the anti-SGEMP function, it provides the necessary protection of electronic circuits 8 against electromagnetic waves.

The closing of the Faraday cage is obtained for the case described here by the presence of base 2 made from or covered by a good electricity conducting metal, such as nickel, silver, aluminium, beryllium or copper. Material 20 must have a thickness exceeding the free mean travel of the electrons emitted by the walls of the cover and also constitutes a covering for the final layer. In particular, in the case of an X-ray protection material covering the inner surface of the mechanical structure, the anti-SGEMP material advantageously constitutes the internal surface of the cover. It is possible to envisage the simultaneous use of an anti-SGEMP layer constituting the inner surface of the box and an anti-SGEMP layer constituting the outer surface of the box.

Figure 2:
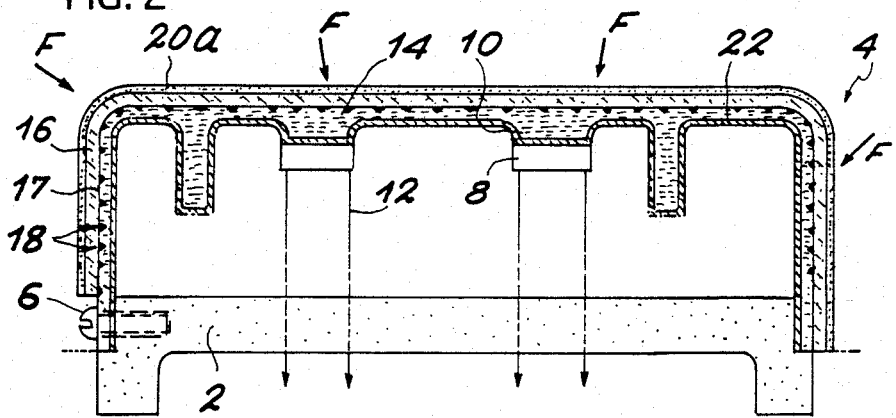
FIG. 2: Diagrammatically and in longitudinal section a second embodiment of the protection means according to the invention.

FIG. 2 shows a second embodiment of the protective means according to the invention, in which the material used for preventing the emissivity effects of the walls of the case exposed to X-rays and in particular material 16 is made from a poor electricity conductor, such as carbon or boron. Under these conditions, the protection of integrated circuits 8 against electromagnetic waves is not assured.

In order to assure this protection, the inner surface of the rigid structure 14 is completely covered with a good electricity conducting layer 22. In particular layer 22 is made from a metal, such as nickel or silver. Layer 22 has a thickness of approximately 0.1 mm. The other parts of the protective box and in particular cover 4 are unchanged compared with FIG. 1.

Figure 3:
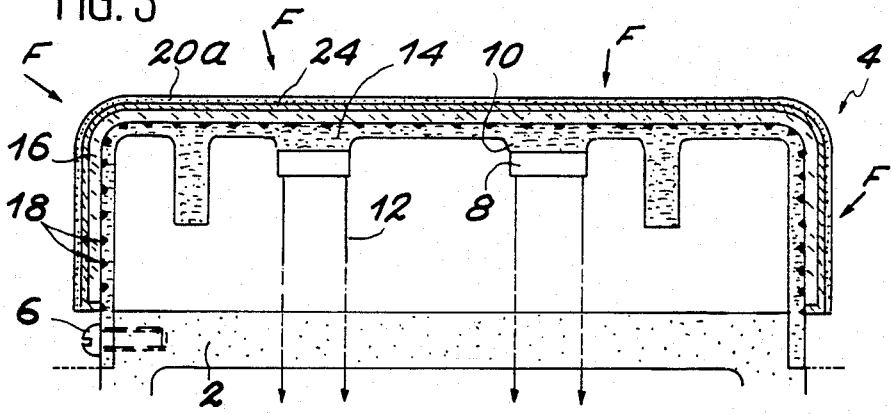
FIG. 3: Diagrammatically and in longitudinal section a third embodiment of the protection means according to the invention.

FIG. 3 shows a third embodiment of the protective box according to the invention. This embodiment differs from that of FIG. 2 only in that the layer serving as the Faraday cage is positioned between the anti-SGEMP material layer 20a and the X-ray protection material layer 16. Layer 24 has a thickness of 0.1 mm and is in particular made from silver or nickel.

As in the case of FIG. 1, the Faraday cage is closed by the presence of base 2 made from a metal or covered with a metal which is a good electricity conductor.

In order to simplify the manufacture of the protective box according to the invention and ensure a good insulation of the electronic circuits 8 against electromagnetic waves, it is possible to provide a faradization layer 22-24 covering both the inner face of mechanical structure 14 (FIG. 2) and the outer surface of the X-ray protection material 16 (FIG. 3). This can be carried out by simply immersing the mechanical structure 14 coated with protective material 16 in a bath containing the metals to be deposited to serve as a Faraday cage (chemical deposition).

It should be noted that the metal faradization layer cannot be applied to a silicone surface due to the poor adhesion of such a metal to such a resin.

The description given hereinbefore has obviously been given in a non-limitative, illustrative manner and modifications are possible without passing beyond the scope of the invention. In particular, the X-ray protection material 16 may only cover the upper face 15 of the mechanical structure or only the side faces 17 thereof. In this case, the anti-SGEMP material 20 or 20a forming the outer surface of the box cover 4, covers all the X-ray material and that part of the rigid structure 14 not covered by X-ray protection material 16. Moreover, when the anti-SGEMP material is a poor electricity conductor, a faradization layer can be inserted between the anti-SGEMP layer 20a and those parts of the outer surface of structure 14 not covered by the X-ray protection material 16.

The protective means according to the invention can be used wherever electronic circuits have to be protected against X-rays. This protection makes it possible to withstand severe surrounding climatic and mechanical conditions. In particular, the invention applies when minimum weight conditions are required. Thus, the protective box according to the invention makes it possible, in the case of an equivalent filtering efficiency to that of a solid material sheet covering a metal mechanical structure, permit gains as regards weight and overall dimensions, as well as a reduction in manufacturing costs. Thus, the protective box according to the invention can be advantageously used for producing very high performance electronic means on-board aircraft.

What is claimed is:

1. A protective box for electronic circuits hardened with respect to x-rays, said protective box comprising a molded rigid mechanical structure of composite material constituted by a fiber-reinforced resin;

an x-ray protection material covering at least parts of said mechanical structure capable of being irradiated by x-rays, said x-ray protection material being potted on said mechanical structure and composed of a resin matrix containing a regularly dispersed powder consisting of at least one metal and/or at least one inorganic compound of a metal, said powder having a melting temperature at least equal to 630° C., said metal and/or metal of the inorganic compound having a high atomic number at least equal to 47; and an anti-SGEMP material which at least partly covers the outer and/or inner surface of the mechanical structure.

2. A protective box according to claim 1, wherein the powder represents 25 to 50% by volume of the x-ray protection material.

3. A protective box according to claim 1, wherein the high atomic number metal is selected from the group consisting of silver, tantalum, tungsten and uranium.

4. A protective box according to claim 1, wherein the anti-SGEMP material includes at least one chemical element with a low atomic number at the most equal to 6.

5. A protective box according to claim 4, wherein the low atomic number element is selected from a group consisting of carbon, boron and beryllium.

6. A protective box according to claim 1, including an electrically conducive material covering the outer surface of the assembly composed of the mechanical structure and the x-ray protection material.

7. A protective box according to claim 1, including a material which is electrically conducive covering the inner surface of the mechanical structure.

8. A protective box according to claim 7, wherein the electricity conducting material is selected from the group consisting of silver, aluminum, beryllium and copper.

9. A protective box according to claim 1, wherein the mechanical structure is provided on its surface covered with the x-ray protection material with slots for improving the adhesion of said material to the mechanical structure.

10. A protective box according to claim 1, wherein the composite material constituting the mechanical structure is formed from a thermosetting resin.

11. A protective box according to claim 1, wherein said anti-SGEMP material has a thickness exceeding the free middle path of electrons emitted during an x-ray irradiation of said box.

* * * * *

UNITED STATES PATENT AND TRADEMARK OFFICE
CERTIFICATE OF CORRECTION

PATENT NO. : 4,833,334
DATED : May 23, 1989
INVENTOR(S) : Valey et al.

It is certified that error appears in the above-identified patent and that said Letters Patent is hereby corrected as shown below:

Column 3, line 54, after "filtering: start a new paragraph.

Column 4, line 38, after "metal" start a new paragraph.

Column 4, line 47, delete "compressiontransfer" and insert --commpression-transfer--.

Column 4, line 49, delete "Application" and insert -- Applicant--.

Column 6, line 15, after "2." start a new paragraph.

Column 6, line 27, delete "Rhone" and insert --Rhône--.

Column 6, line 44, delete "lots" and insert --slots--.

Column 9, line 6, delete "a" and insert --the--.

Column 9, line 15, delete "7" and insert --6--.

Signed and Sealed this

Sixth Day of February, 1990

Attest:

JEFFREY M. SAMUELS

Attesting Officer          Acting Commissioner of Patents and Trademarks